United States Patent
Shin et al.

(10) Patent No.: US 7,778,082 B2
(45) Date of Patent: Aug. 17, 2010

(54) NON-VOLATILE MEMORY DEVICE AND PROGRAMMING METHOD

(75) Inventors: Yoo-Cheol Shin, Suwon-si (KR); Jung-Dal Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 12/186,644

(22) Filed: Aug. 6, 2008

(65) Prior Publication Data

US 2009/0040833 A1 Feb. 12, 2009

(30) Foreign Application Priority Data

Aug. 6, 2007 (KR) .................. 10-2007-0078561

(51) Int. Cl.
*G11C 11/34* (2006.01)
(52) U.S. Cl. ..................... 365/185.19; 365/185.24
(58) Field of Classification Search ............ 365/185.19, 365/185.24
See application file for complete search history.

(56) References Cited

U.S. PATENT DOCUMENTS

| 5,473,563 | A | * | 12/1995 | Suh et al. | 365/185.13 |
|---|---|---|---|---|---|
| 5,642,309 | A | * | 6/1997 | Kim et al. | 365/185.22 |
| 5,677,873 | A | * | 10/1997 | Choi et al. | 365/185.17 |
| 5,715,194 | A | * | 2/1998 | Hu | 365/185.17 |
| 6,044,017 | A | * | 3/2000 | Lee et al. | 365/185.18 |
| 6,061,270 | A | * | 5/2000 | Choi | 365/185.02 |
| 7,269,068 | B2 | * | 9/2007 | Chae et al. | 365/185.18 |
| 7,286,398 | B2 | * | 10/2007 | Yano et al. | 365/185.04 |
| 2007/0086251 | A1 | * | 4/2007 | Lutze et al. | 365/195 |

FOREIGN PATENT DOCUMENTS

| KR | 100145475 B1 | 4/1998 |
|---|---|---|
| KR | 1020050002245 A | 1/2005 |
| KR | 100496797 B1 | 6/2005 |
| KR | 1020060070724 A | 6/2006 |

* cited by examiner

*Primary Examiner*—Michael T Tran
(74) *Attorney, Agent, or Firm*—Volentine & Whitt, PLLC (57) ABSTRACT

Provided are a non-volatile memory device and a programming method. The programming method includes applying a program voltage to a selected word line, applying an elevated pass voltage to word lines adjacent to the selected word line in a plurality of word lines, and applying a pass voltage to remaining word lines in the plurality of word lines.

13 Claims, 9 Drawing Sheets

Vpass < Vpass+ < Vpgm

Vpass < Vpass+ < Vpgm

Fig. 9

NON-VOLATILE MEMORY DEVICE AND PROGRAMMING METHOD

CROSS-REFERENCE TO RELATED APPLICATIONS

This U.S. non-provisional patent application claims priority under 35 U.S.C. §119 to Korean Patent Application No. 10-2007-0078561 filed on Aug. 6, 2007, the subject matter of which is hereby incorporated by reference.

BACKGROUND OF THE INVENTION

The present invention relates generally to non-volatile memory devices and related programming methods.

Non-volatile memory devices retain stored data when supplied power is interrupted. Flash type memory devices (hereafter "flash memory") are one type of electrically erasable non-volatile memory commonly used in computers and memory cards.

Flash memory may be classified into NOR type flash and NAND type flash according to the logic gate connection between constituent memory cells and bit lines. NOR flash consumes greater current and has a less dense integration, but enjoys higher speed operation. NAND flash consumes less current and has greater integration density.

The memory cells in NAND flash are erased and programmed using the so-called Fowler-Nordheim tunneling phenomenon. Methods of erasing and programming NAND flash are disclosed, for example in U.S. Pat. Nos. 5,473,563 and 5,696,717, collective subject matter of which is hereby incorporated by reference.

NAND flash programming of selected memory cells may be had using an incremental step pulse programming (ISPP) method which accurately controls threshold voltage distributions for programmed memory cells. An exemplary circuit generating a program voltage for use during an ISPP method is disclosed, for example, in U.S. Pat. No. 5,642,309, the subject matter of which is hereby incorporated by reference.

However, conventional programming techniques suffer from a number of potential problems. For example, non-selected memory cells (i.e., memory cells not intended to be programmed during a current programming operation) may be adversely influenced by the programming operation directed to selected memory cells connected to the same word line. The program voltage is applied to the word line during the programming operation affects both selected and non-selected memory cells connected to the word line. Some non-selected memory cells connected to the word line, and especially those memory cells adjacent to a selected memory cell, may be programmed (or partially programmed) together with the selected memory cells. Instances where a non-selected memory cell connected to the selected word line (i.e., a word line receiving a program voltage during a program operation) are unintentionally programmed is commonly referred to as a "program disturb."

A number of conventional approaches have been proposed to address the issue of program disturbs. One approach uses a program inhibit method characterized by a self-boosting scheme. See, for example, U.S. Pat. Nos. 5,677,873 and 5,991,202, the collective subject matter of which is hereby incorporated by reference.

In general, a program inhibit method using a self-boosting scheme cuts off a ground path by applying 0V to the gate of a ground selection transistor. This 0V signal is applied to the selection bit line while power supply voltages (e.g., 3.3V and 5V) are applied to a non-selected bit line as a program inhibit voltage. Simultaneously, by applying a power supply voltage to the gate of a string selection transistor, the source of a string selection transistor is charged from Vcc to Vth, where Vth is a threshold voltage of the string selection transistor, and the string selection transistor is substantially turned OFF. Then, a channel voltage of a program inhibited cell transistor is boosted by applying a program voltage Vpgm to a selected word line and applying a pass voltage Vpass to non-selected word lines. This prevents F-N tunneling between the floating gate and channel, such that the program inhibited cell transistor maintains an erase state.

Another program inhibit method using a local self-boosting scheme is presented in U.S. Pat. Nos. 5,715,194 and 6,061,270, the collective subject matter of which is hereby incorporated by reference.

According to the program inhibit method using the local self-boosting, a 0V signal is applied to the two (2) non-selected word lines adjacent to the selected word line. After a pass voltage Vpass (e.g., 10V) is applied to another non-selected word lines, the program voltage Vpgm is applied to the selected word line. Due to this bias scheme, the channel of a self-boosted cell transistor is limited to the selected word line. Moreover, the channel boosting voltage of the program inhibited cell transistor is further increased through the method using local self-boosting than the foregoing method using self-boosting. Therefore, F-N tunneling does not occur between the floating gate and channel of the program inhibited cell transistor, such that the program inhibited cell transistors maintains an erase state.

SUMMARY OF THE INVENTION

Certain embodiments of the invention provide a method of overcoming the limitations caused by cell size decrease by minimizing a voltage difference between cell transistors even when a high voltage is applied.

Embodiments of the invention provide a method of programming a non-volatile memory device, where the method inhibits or prevents insulation damage and leakage current between cell transistors during a program operation.

Embodiments of the invention also provide a non-volatile memory device capable of applying an elevated pass voltage to word lines adjacent to a selected word line during a program operation. The elevated pass voltage is higher than a normal pass voltage by a predetermined level. The pass voltage is applied to the remaining word lines.

In one embodiment, the invention provides a programming method for a non-volatile memory device, comprising; applying a program voltage to a selected word line, applying an elevated pass voltage to word lines adjacent to the selected word line in a plurality of word lines, and applying a pass voltage to remaining word lines in the plurality of word lines.

In another embodiment, the invention provides a non-volatile memory device comprising; a memory cell array comprising a plurality of memory cells disposed at intersections between word lines and bit lines, a word line voltage generator generating a program voltage, an elevated pass voltage and a pass voltage during a program operation, and a row decoder receiving the program voltage, the elevated pass voltage, and the pass voltage, and selecting one of the word lines in response to a row address, wherein the program voltage is applied to a word line selected by the row decoder, the elevated pass voltage is applied to word lines adjacent to the selected word line, and the pass voltage is applied to the remaining word lines other than the selected word line and the adjacent word lines, and the elevated pass voltage is lower than the program voltage but higher than the pass voltage.

DESCRIPTION OF EMBODIMENTS

The conventional program inhibit methods noted above using either a self-boosting or a local self-boosting scheme have certain limitations that allow program disturbs to occur with greater frequency as the overall degree of flash memory cell integration increases. That is, as the degree of integration increases, the interval between adjacent signal lines necessarily decreased, and voltage coupling between adjacent signal lines becomes more prevalent. For example, while programming a memory cell adjacent to a string selection transistor, the power supply voltage being applied to the string selection line may be boosted due to coupling between word lines if a program voltage is applied to the selected word line. The voltage increase on the string selection line allows electrical charge developed in a channel of the program inhibited cell transistor to transfer to a non-selected bit line through the string selection transistor which may change from an OFF state to an ON state in accordance with the voltage increase. Consequently, the channel voltage of the program inhibited cell transistor may decrease. Therefore, a program disturb may occur in relation to the program inhibited cell transistors.

Additionally, as NAND flash become more highly integrated, the space between cell transistors is reduced, but data retention and overall performance characteristics must be maintained. Accordingly, a material (or effective) decreases in the thickness of a tunnel dielectric layer and/or a blocking dielectric layer for cell transistors should not occur. However, if there is no thickness change in the tunnel dielectric layer and blocking dielectric layer, the space reduction between cell transistors may result in insulation damage and/or leakage current associated with the dielectric material(s) between cell transistors because one or more operating voltage(s) applied to the cell transistor is the same as situations where high voltage operation is required.

Hereinafter, embodiments of the invention will be described in some additional detail with reference to the accompanying drawings.

In certain embodiments of the invention, a non-volatile memory device applies an elevated pass voltage to word lines adjacent to a selected word line during a program operation. The elevated pass voltage is higher by a predetermined level than a normal pass voltage applied to the remaining word lines. Accordingly, the non-volatile memory device has a relatively small voltage difference between a selected word line and adjacent word lines during a program operation. This prevents insulation damage and reduces leakage current.

Figure 1:
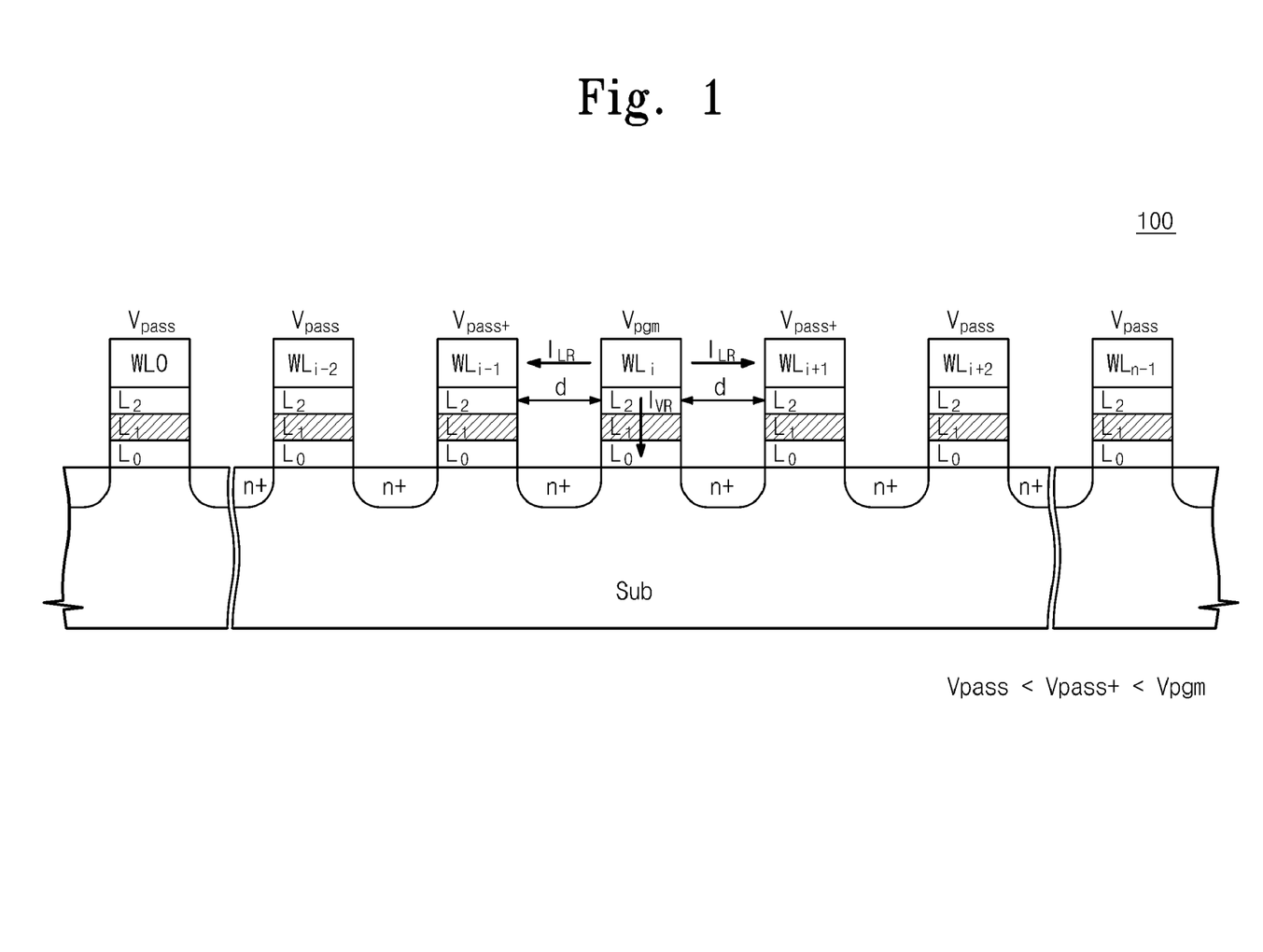
FIG. 1 is a view illustrating programming requirements for a non-volatile memory device according to an embodiment of the invention.

FIG. (FIG.) 1 is a view illustrating programming requirements for a non-volatile memory device 100 according to an embodiment of the invention. The non-volatile memory device 100 includes a string of a NAND flash memory device. However, it will be apparent to those skilled in the art that embodiments of the invention are limited to only NAND flash. Rather, non-volatile memory device 100 may be an MRAM, a PRAM, an FRAM, a NOR flash, etc.

Referring to FIG. 1, the non-volatile memory device 100 applies a program voltage Vpgm to a selected word line WLi, an elevated pass voltage Vpass+ to non-selected word lines WLi−1 and WLi+1 adjacent thereto, and a (normal) pass voltage Vpass to the remaining word lines WL0 to WLi−2, and WLi+1 to WLn−1. Here, the adjacent word lines WLi−1 and WLi+1 are disposed to the left and right of the selected word line WLi. However, so-called adjacent word lines WLi−1 and WLi+1 need not necessarily be disposed to the left and right of a selected word line WLi. For example, the adjacent word lines WLi−1 and WLi+1 may be a plurality of word lines disposed first and second to the left or right of a selected word line WLi. (The terms "left" and "right" are used here to describe relative disposition drawn in relation to the illustrated embodiments. Those skilled in the art will recognize that such relative orientation terms are not limiting in a restrictive manner, but are merely used to clearly teach the making an use of the invention in the context of the illustrated embodiments).

As non-volatile memory devices become more highly integrated, the interval between adjacent word lines becomes narrower. However, to maintain the overall data retention characteristics of the non-volatile memory device, the thickness of layers L0-L1-L2 should remain substantially the same, assuming a commonality of materials between non-volatile memory devices having different integration densities. Herein, L0 is a tunnel oxide layer, L1 is a charges storage layer, and L2 is a blocking layer. For example, L0 may be an oxide layer, L1 may be a nitride layer, and L2 may be an oxide layer (i.e., O—N—O dielectric layer). At this point, as the interval between word lines becomes narrower, a dielectric layer may be damaged due to a high voltage difference between the selected word line WLi and the non-selected word lines WLi−1 and WLi+1. Additionally, because only the interval "d" between the word lines is reduced without change of the thickness of the O—N—O dielectric layer, a horizontal leakage current $I_{LR}$ may become a principal factor in malfunction operations, as compared with a vertical leakage current $I_{VR}$.

An oxide layer separating adjacent word lines may suffer from leakage current problems more than the O—N—O dielectric layer. (See, as further background information, IEEE IRPS entitled, "A 100 Å Thick Stacked SiO2/Si3N4/SiO2 Dielectric Layer for Memory Capacitor," (1985)).

Accordingly, the non-volatile memory device 100 prevents an insulation layer between the word lines from being damaged during a program operation and also reduces a leakage current simultaneously by applying an elevated pass voltage Vpass+ to the word lines WLi−1 and WLi+1 adjacent to the selected word line WLi. The elevated pass voltage Vpass+ is higher by a predetermined level than the pass voltage Vpass applied to the remaining word lines WL0 to WLi−2 and WLi+2 to WLn-1. At this point, the elevated pass voltage Vpass+ should have a voltage level that does not damage an insulation layer between the word lines. The elevated pass voltage Vpass+ needs to remain within a range satisfying the following two Equations 1 and 2.

$$0 < Vpgm - Vpass_+ < V_{BD} \quad \text{(Eq. 1)}$$

$$0 < Vpgm_+ - Vpass < V_{BD} \quad \text{(Eq. 2)}$$

where $V_{BD}$ is a breakdown voltage of an insulation layer between word lines. The breakdown voltage $V_{BD}$ will vary with different kinds of insulation layers.

Thus, the non-volatile memory device 100 may be fabricated to prevent a voltage developed between the word lines from exceeding the breakdown voltage $V_{BD}$. For example, the elevated pass voltage Vpass+ is applied to the word lines WLi−1 and WLi+1 adjacent to the selected word line WLi. The elevated pass voltage Vpass+ is higher by a predetermined level than the pass voltage Vpass applied to the remaining word lines WL0 to WLi−2 and WLi+2 to WLn-1. Accordingly, even if the interval "d" between the word lines becomes narrower as non-volatile memory device 100 becomes more highly integrated, the constituent insulation layer will not damaged and leakage current is reduced. These characteristics improve reliability of memory cells.

Figure 2:
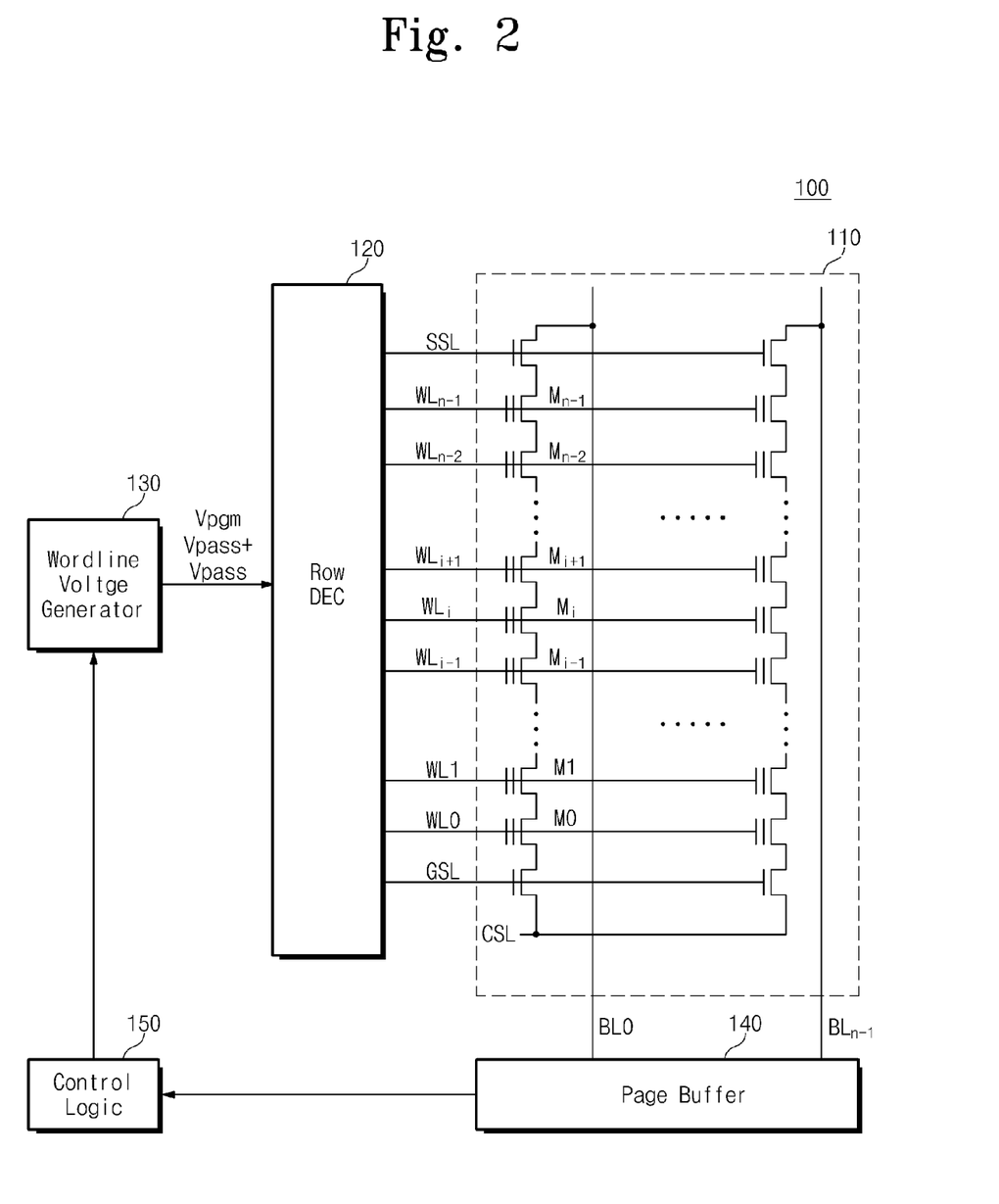
FIG. 2 is a block diagram illustrating a non-volatile memory device according to an embodiment of the invention.

FIG. 2 is a block diagram illustrating a non-volatile memory device 100 according to an embodiment of the invention. Referring to FIG. 2, the non-volatile memory device 100 comprises a memory cell array 110, a row decoder 120, a word line voltage generator 130, a page buffer 140, and a control logic 150. The non-volatile memory device 100 applies the elevated pass voltage Vpass+ to word lines WLi−1 and WLi+1 adjacent to a selected word line WLi. The elevated pass voltage Vpass+ is higher by a predetermined level than a pass voltage Vpass applied to the remaining word lines WL0 to WLi−2 and WLi+2 to WLn-1.

The memory cell array 110 is a storage region comprising an array of memory cells. The memory cell array 110 comprises a plurality of bit lines and word lines and a plurality of memory cells arranged on regions where the bit lines and the word lines intersect. The memory cell array 110 is subdivided into a plurality of memory blocks. Only one memory block is illustrated in FIG. 2. Referring to FIG. 2, each memory block of the memory cell array 110 includes a plurality of cell strings. For convenience of explanation, it is assumed that each string has the "n" memory cells. However, it will be apparent to those skilled in the art that "n" may be any reasonable number of memory cells.

Each string includes a plurality of charge storage layers M0 to Mn-1. The charge storage layers M0 to Mn-1 are connected in series between a string selection transistor SST and a ground selection transistor GST, which are arranged in each storing. A plurality of the word lines WL0 to WLn-1 are arranged to intersect each string. The word lines WL0 to WLn-1 are respectively connected to control gates of the charge storage layers M0 to Mn-1 corresponding to each string. By applying a program/read voltage to a selected word line, data can be programmed into or read from selected memory cells. The non-volatile memory device 100 includes the page buffer 140 for storing data in the memory cell array 110 or reading the data from the page buffer 140. However, one string may include two ground selection transistors or two string selection transistors according to a method of forming a circuit and a method of applying a voltage for programming.

The row decoder 120 decodes a row address provided from a row address buffer (not shown) to select a word line to be programmed. During a program operation, the non-volatile memory device 100 applies a program voltage Vpgm to a selected word line WLi, the elevated pass voltage Vpass+ to non-selected word lines WLi−1 and WLi+1 adjacent thereto, and a pass voltage Vpass to the remaining word lines WL0 to WLi−2, and WLi+1 to WLn-1. The program voltage Vpgm, the elevated pass voltage Vpass+, and the pass voltage Vpass are provided from the word line voltage generator 130. The word line voltage generator 130 generates the program voltage Vpgm, the elevated pass voltage Vpass+, and the pass voltage Vpass according to a control of the control logic 150.

The page buffer 140 stores data in the memory cell array 110 and reads stored data from it. The page buffer circuit 140 is connected to the memory cell array 110 through a plurality of bit lines BL0 to BLn-1. As is conventionally understood, the page buffer 140 comprises a plurality of page buffers (not shown) which are respectively connected to selected ones of bit lines BL0 to BLn-1. Each page buffer stores data to be programmed or data read from memory cell array 110. The page buffer 140 applies a ground voltage (i.e., 0V) or a power supply voltage Vcc to the page buffer 140 according to a data value stored in each page buffer during programming. For example, a ground voltage (i.e., 0V) is applied to a bit line (the bit line is connected to memory cells to be programmed) connected to a page buffer for storing data of '0'. Additionally, a power supply voltage Vcc is applied to a bit line (the bit line is connected to program inhibited memory cells) connected to a page buffer for storing data of '1'.

The control logic 150 controls the word line voltage generator 130 to generate the elevated pass voltage Vpass+ that is lower than the program voltage Vpgm but higher than the pass voltage Vpass. This will be described in more detail with reference to FIGS. 3 and 4.

The non-volatile memory device generates a word line voltage so that a voltage difference between the word lines does not exceed a breakdown voltage during a program operation. That is, the non-volatile memory device 100 applies a program voltage Vpgm to a selected word line WLi, the elevated pass voltage Vpass+ to adjacent non-selected word lines WLi−1 and WLi+1, and a pass voltage Vpass to the remaining word lines WL0 to WLi−2, and WLi+1 to WLn-1.

Figure 3:
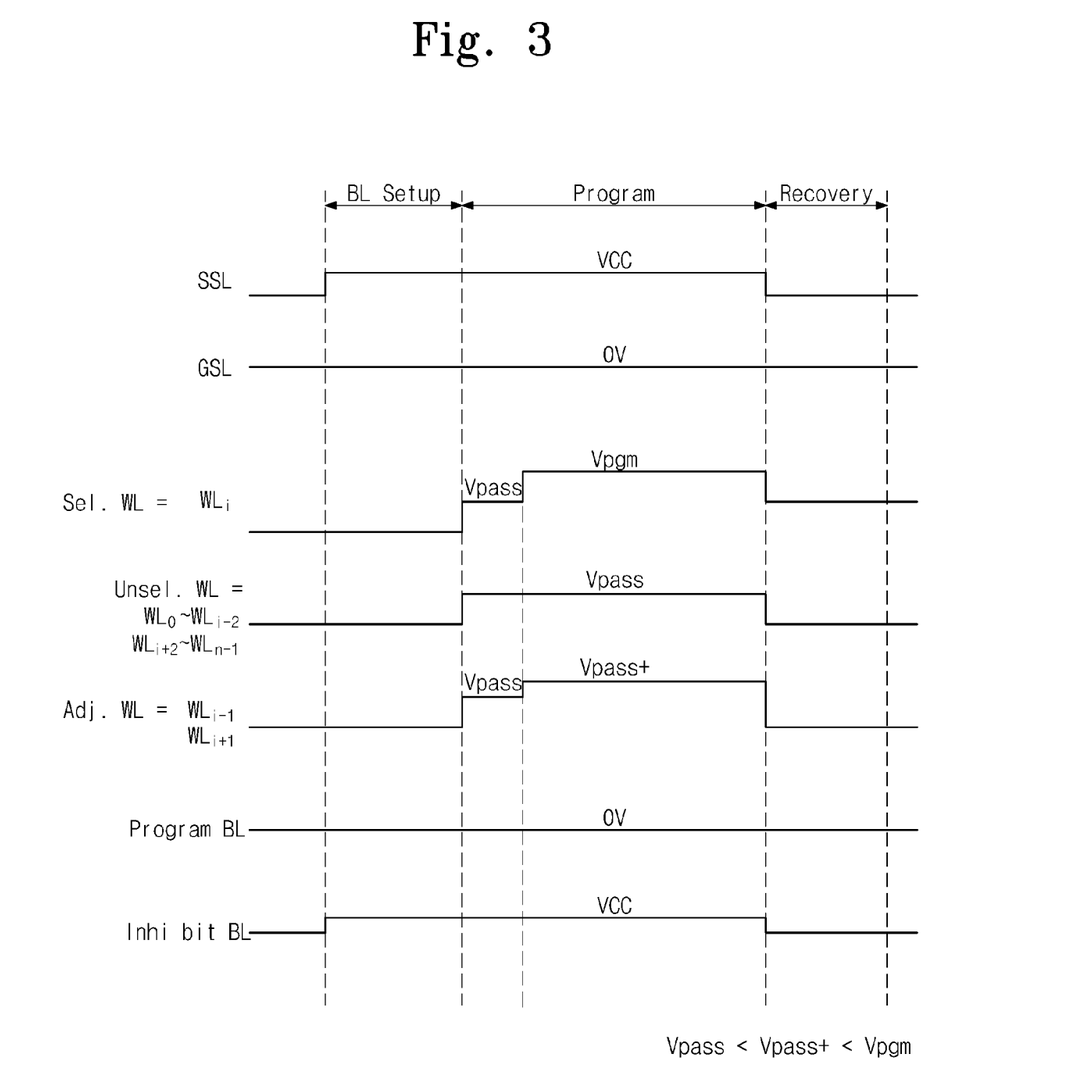
FIG. 3 is a related timing diagram illustrating a program operation for a non-volatile memory device according to an embodiment of the invention.

FIG. 3 is a related timing diagram illustrating a program operation for a non-volatile memory device according to an embodiment of the invention. Referring collectively to FIGS. 1 through 3, the program operation will now be described.

First, data to be programmed are loaded into the page buffer 140 through an input/output buffer (not shown) and a column selection circuit (not shown) according to a control of the control logic 150. Simultaneously, the word line voltage generator 130 generates the program voltage Vpgm, the elevated pass voltage Vpass+, and the pass voltage Vpass under the control of the control logic 150. As described above, the elevated pass voltage Vpass+ is lower than the program voltage Vpgm but higher than the pass voltage Vpass. The bit lines BL0 to BLn-1 are set with a power supply voltage or a ground voltage, respectively, according to the data to be programmed and loaded into the page buffer 140. For example, as illustrated in FIG. 3, when program data (e.g., data '0') are loaded into the page buffer 140, the bit line is set with the ground voltage. When program inhibit data (e.g., data '1') are loaded into the page buffer 140, the bit line is set with a power supply voltage. After the bit lines BL0 to BLn-1 are set with a power supply voltage or a ground voltage, respectively, according to the loaded data, the row decoder 120 supplies voltages from the word line voltage generator 130 into the corresponding word lines WL0 to WLn-1, respectively, in response to the inputted row address.

For convenience of explanation, it is assumed that a word line WLi is selected from an arbitrary memory block. Under this assumption, the program voltage Vpgm drives a selected word line WLi, the elevated pass voltage Vpass+ drives adjacent non-selected word lines WLi−1 and WLi+1, and the pass voltage Vpass drives the remaining word lines WL0 to WLi−2, and WLi+1 to WLn-1. As illustrated in FIG. 3, the pass voltage Vpass drives the selected word line WLi during a predetermined time, and then the program voltage Vpgm drives them. Or, the elevated pass voltage Vpass+ drives the selected word line WLi during a predetermined time, and then the program voltage Vpgm drives the selected word line WLi. Under the above-described bias conditions, memory cells of the selected word line WLi will be programmed or program inhibited. Next, once all the memory cells of the selected word line WLi are programmed, as illustrated in FIG. 3, a voltage supplied to each line is discharged to a reference voltage (e.g., a ground voltage).

Figure 4:
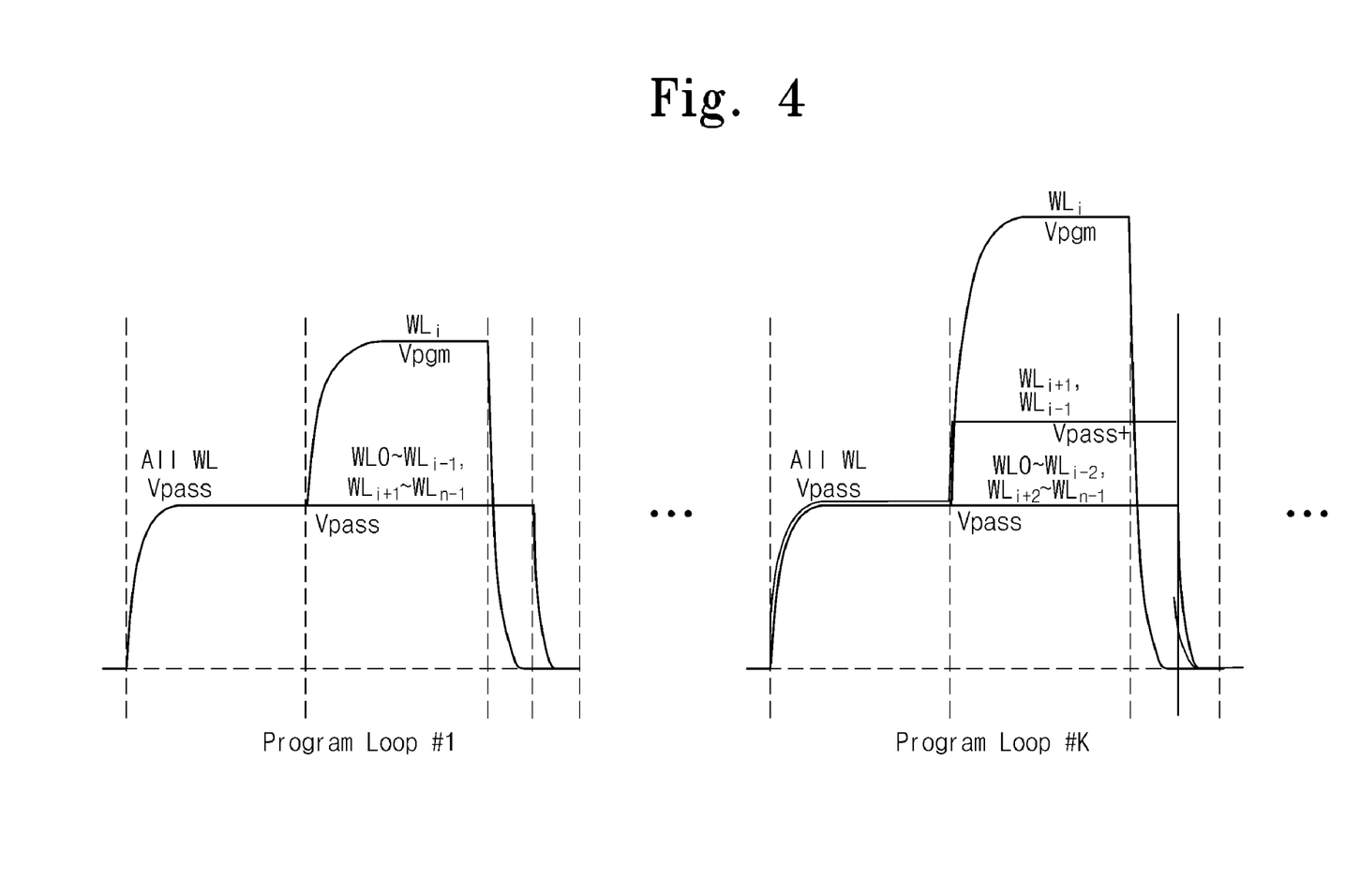
FIG. 4 is a view illustrating a program voltage provided to word lines of a non-volatile memory device through an ISPP scheme.

FIG. 4 is a view illustrating a program voltage provided to word lines of a non-volatile memory device using an incremental step pulse programming (ISPP) scheme. According to the exemplary ISPP scheme, the program voltage Vpgm has a pulse waveform with a predetermined width during a repeated programming cycle (i.e., a programming cycle characterized by multiple program loops). As is conventionally understood, the level of the pulse is incrementally increased from a defined minimum to a defined maximum. (See, for example, as further background, Suh, Kand-Deon, et al., at IEEE Journal of Solid-State Circuits, vol. 30, No.11, pp. 1149-1156 (November 1995), entitled, "A 3.3V 32 Mb NAND Flash Memory with Incremental Step Pulse Programming Scheme").

Referring to FIG. 4, the non-volatile memory device according to an embodiment of the invention provides the elevated pass voltage Vpass+ to adjacent word lines WLi−1 and WLi+1 (i.e., two word lines adjacent to the selected word line of a program operation) once a predetermined maximum number of program loops k has been exceeded. That is, as the number of applied program loops increases beyond k, the elevated pass voltage Vpass+ may be derived by increasing the pass voltage Vpass by the predetermined level.

Figure 5:
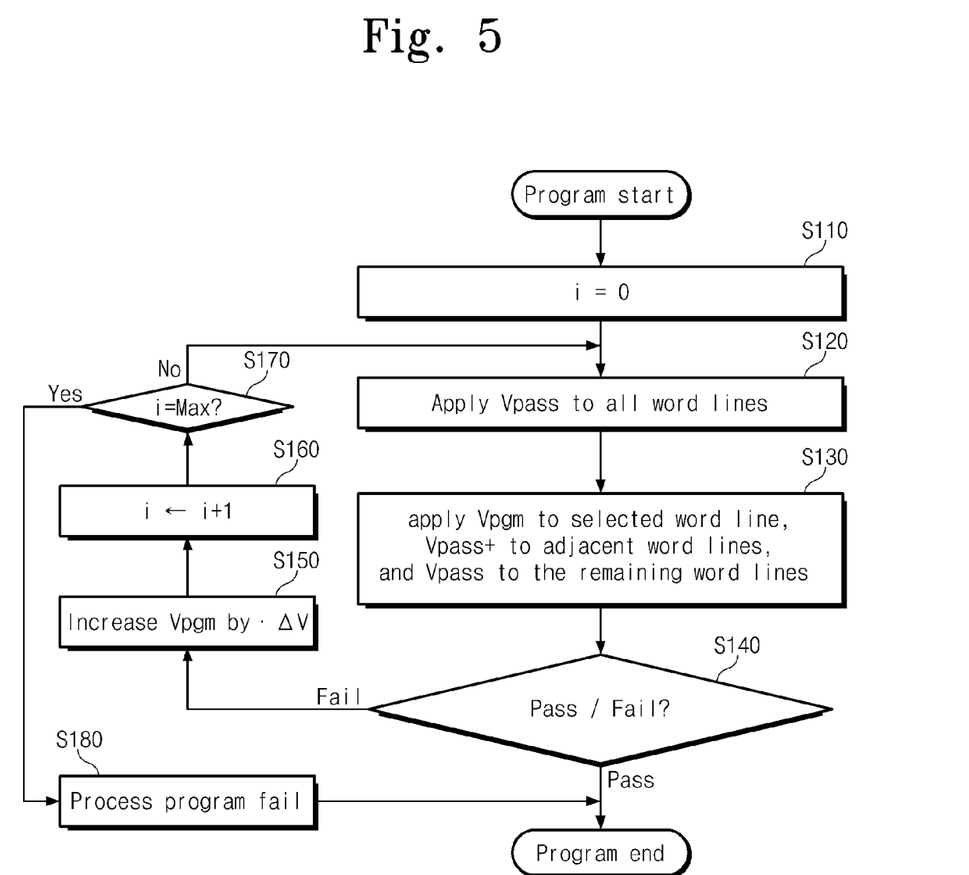
FIG. 5 is a flowchart illustrating a programming method for a non-volatile memory device according to an embodiment of the invention.

FIG. 5 is a flowchart illustrating a programming method for a non-volatile memory device according to an embodiment of the invention. Referring to FIGS. 2 and 5, the programming method will be described. It is assumed that the programming method of FIG. 5 uses an ISPP scheme, such as the one noted above. In operation S110, the bit lines BL0 to BLn-1 are set up for performing a program operation during an initial program loop. The setting of the bit lines BL0 to BLn-1 is the same as FIG. 3. Word line voltages are applied after the setting of the bit lines BL0 to BLn-1. In operation S120, the pass voltage Vpass is applied to the word lines WL0 to WLn-1 first. After that, during a predetermined time, the non-volatile memory device applies the program voltage Vpgm to the selected word line WLi, the elevated pass voltage Vpass+ to the non-selected word lines WLi−1 and WLi+1 adjacent thereto, and the pass voltage Vpass to the remaining word lines WL0 to WLi−2, and WLi+1 to WLn-1 in operation S130. In operation S140, the control logic 150 controls the page buffer 140 to read data from memory cells connected to the selected word line WLi, and determines whether a program operation is normally performed or not by comparing the read data with pass data (i.e., pass or fail). In operation S150, if program fail occurs according to a determination result, the control logic 150 controls the word line voltage generator 130 to increase the program voltage Vpgm by a predetermined level ΔV. Then, the number of program loops increases in operation S160. In operation S170, the control logic 150 determines whether the number of program loops exceeds the maximum value or not, and if not, it proceeds to operation S120 after the setting of the bit line. If the number of program loops exceeds the maximum value, it is determined as program fail in operation S180.

Figure 6:
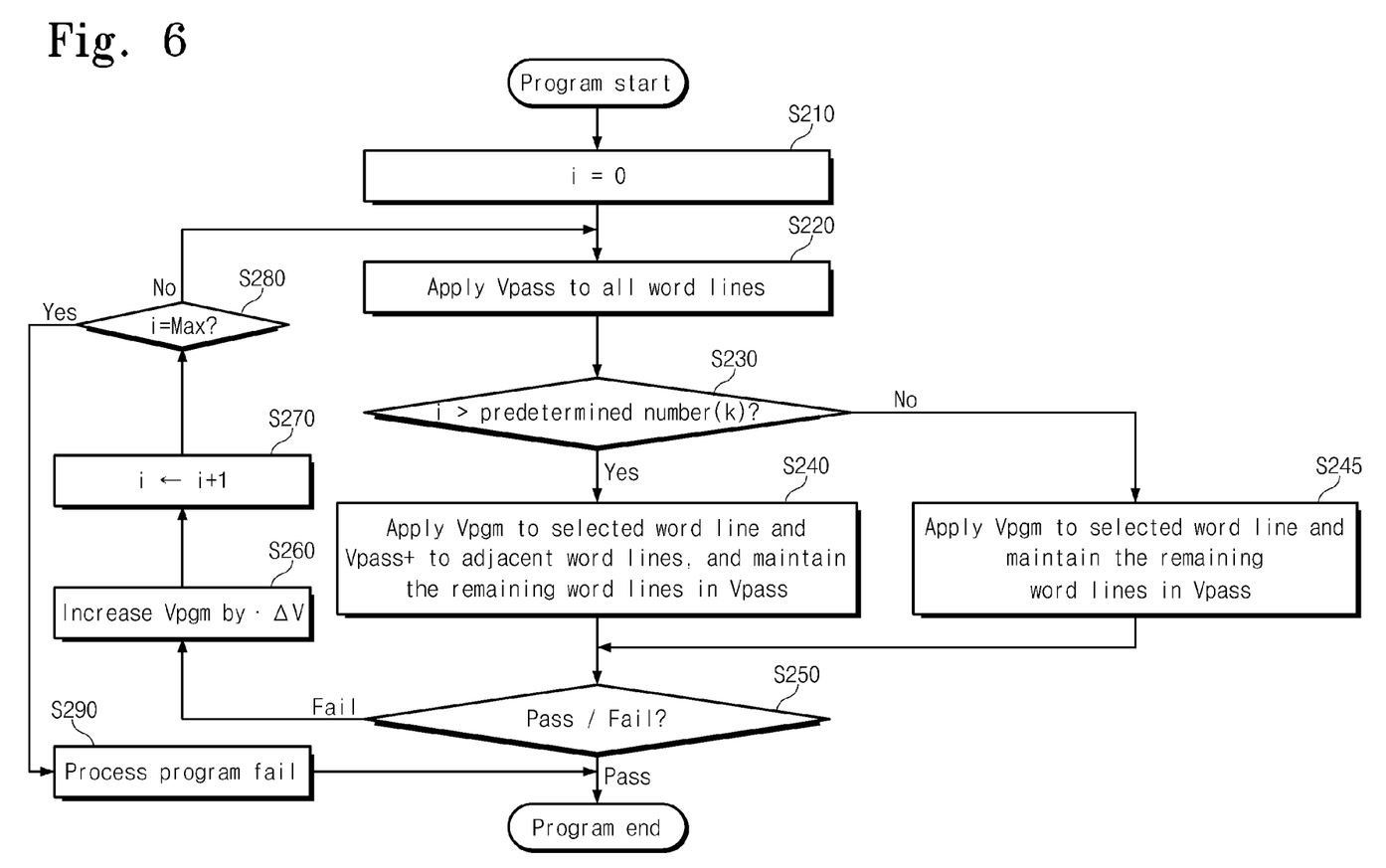
FIG. 6 is a flowchart illustrating a programming method for a non-volatile memory device according to another embodiment of the invention.

FIG. 6 is a flowchart illustrating a programming method for a non-volatile memory device according to another embodiment of the invention. The programming method of FIG. 6 applies the elevated pass voltage Vpass+ to the word lines WLi−1 and WLi+1 adjacent to the selected word line WLi when the number of program loops exceeds a predetermined number k in operation S240. The control logic 150 determines whether the number of program loops exceeds the predetermined number k or not, and then according to a determination result, determines whether the elevated pass voltage Vpass+ or the pass voltage Vpass is applied to the word lines WLi−1 to WLi−1 adjacent to the selected word line WLi. In more detail, if the number of program loops exceeds the predetermined number k, the control logic 150 controls the word line voltage generator 130 to apply the program voltage Vpgm to the selected word line WLi, the elevated pass voltage Vpass+ to adjacent non-selected word lines WLi−1 and WLi+1, and the pass voltage Vpass to the remaining word lines WL0 to WLi−2, and WLi+1 to WLn-1.

Figure 7:
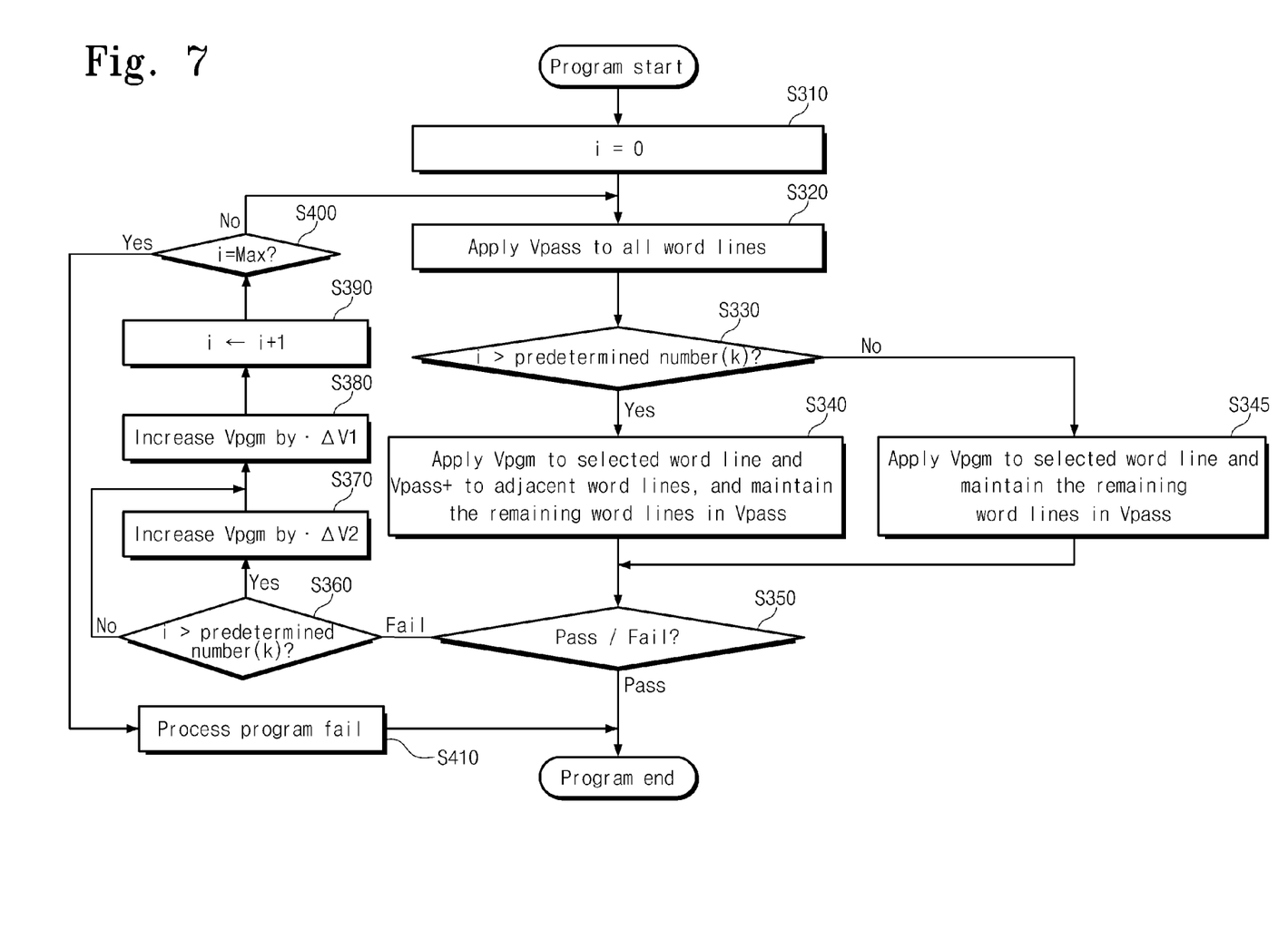
FIG. 7 is a flowchart illustrating a programming method for a non-volatile memory device according to yet another embodiment of the invention.

FIG. 7 is a flowchart illustrating a programming method for a non-volatile memory device according to yet another embodiment of the invention. The programming method of FIG. 7 increases the pass voltage Vpass by the predetermined level and then applies the resulting elevated pass voltage Vpass+ to the word lines WLi−1 and WLi+1 adjacent to the selected word line WLi when the number of program loops exceeds the predetermined number k in operation S370.

As noted above, a programming method according to an embodiment of the invention prevents a voltage difference between word lines from exceeding a breakdown voltage of an insulation layer. Accordingly, a programming method according to an embodiment of the invention not only prevents damage of an insulation layer between word lines, but also reduces leakage current even when the degree of integration in a memory is increased.

Figure 8:
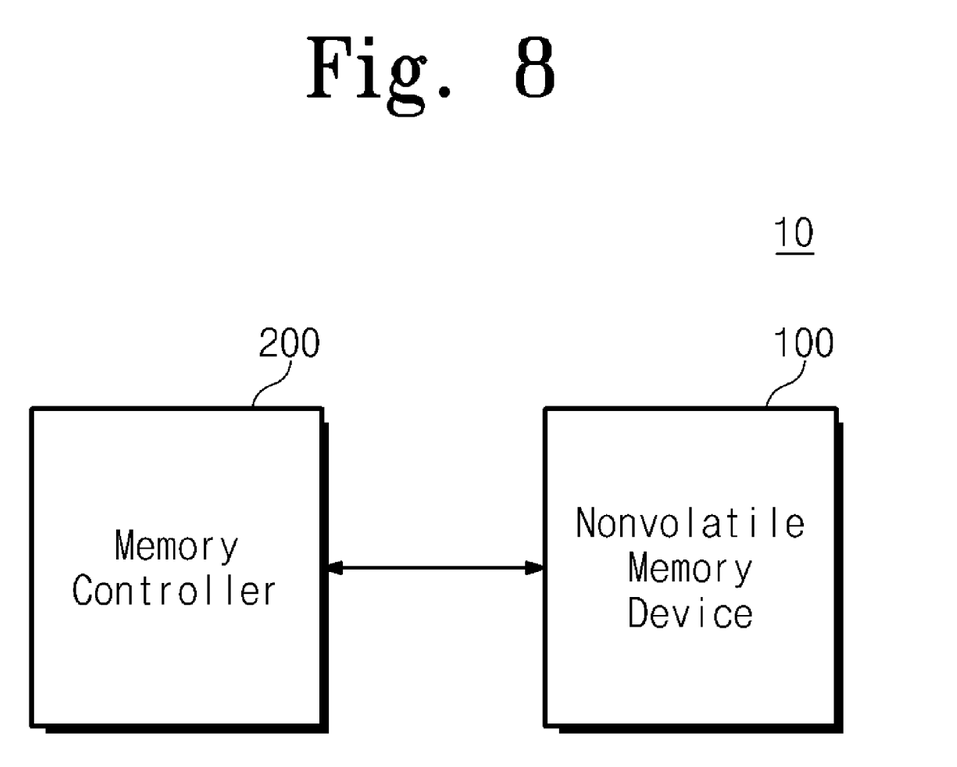
FIG. 8 is a block diagram illustrating a memory system including a non-volatile memory device.

FIG. 8 is a block diagram illustrating a memory system 10 comprising a non-volatile memory device according to an embodiment of the invention. Referring to FIG. 8, the memory system 10 includes a memory controller controlling non-volatile memory device 100. In one embodiment, the non-volatile memory device 100 may be identical to that of FIG. 2.

The flash memory device is a kind of the non-volatile memory device retaining its stored data even when power supply is cut off. As demands for mobile devices such as a mobile phone, a PDA, a digital camera, a portable game console, and an MP3 player are increased, the flash memory device becomes widely used as a data storage and a code storage. Additionally, the flash memory device also may be applicable to home applications such as a HDTV, a DVD, a router, and a GPS.

Figure 9:
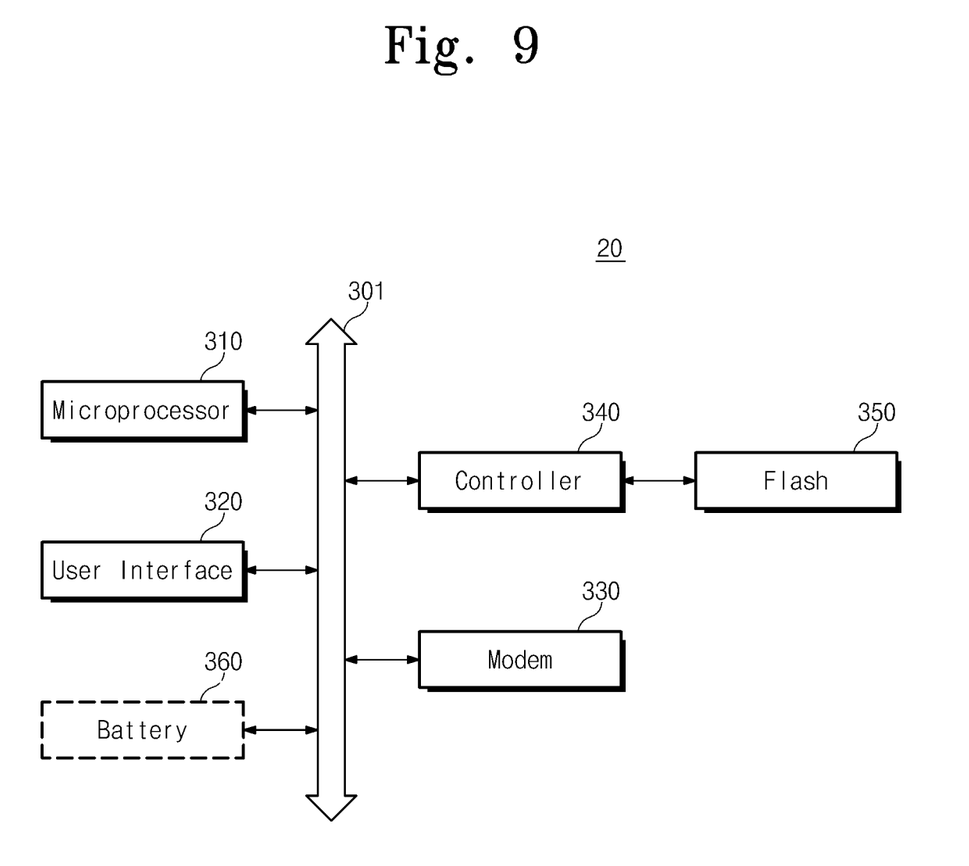
FIG. 9 is a view illustrating a computational logic system incorporating a flash memory device according to an embodiment of the invention.

FIG. 9 is a view illustrating a computational logic system incorporating a flash memory device according to an embodiment of the invention and a corresponding memory controller. Computational logic system 20 comprises a microprocessor 310, a user interface 320, a modem 330 such as a baseband chipset, a memory controller 340, and a flash memory device 350, which are all connected through a bus 301. The flash memory device 350 has the same structure identical to that of FIG. 2. N-bit data processed or to be processed by the microprocessor 310, where N is an integer equal to or greater than 1, is stored in the flash memory device 350 by the memory controller 340.

If the computational logic system 20 is a mobile device, a battery 360 is additionally provided for an operation voltage of the computing system 20. Although not illustrated in the drawings, it is apparent to those skilled in the art that the computing system 20 may further include an application chipset, a camera image processor (CIS), a mobile DRAM, etc. For example, a solid state drive/disk (SSD) of a non-volatile memory may be used for storing data.

The flash memory device and/or the memory controller of the present invention may be mounted through various forms of packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

The non-volatile memory device according to embodiments of the invention minimizes a voltage difference between a selected word line and word lines adjacent thereto during a program operation. Therefore, insulation damage and of a dielectric layer between cell transistors can be prevented and a leakage current can be reduced.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A programming method for a non-volatile memory device, the method comprising:
    applying a program voltage to a selected word line;
    applying an elevated pass voltage to word lines adjacent to the selected word line in a plurality of word lines; and
    applying a pass voltage to remaining word lines in the plurality of word lines,
    wherein the elevated pass voltage is higher than the pass voltage and lower than the program voltage, and
    a voltage difference between the program voltage and the elevated pass voltage and a voltage difference between the elevated pass voltage and the pass voltage are less than a breakdown voltage of an insulation layer disposed between adjacent word lines in the plurality of word lines.

2. The method of claim 1, wherein the adjacent word lines are disposed on opposite sides of the selected word line.

3. The method of claim 1, wherein the non-volatile memory device is programmed using an incremental step pulse programming (ISPP) scheme.

4. The method of claim 3, wherein the elevated pass voltage is applied to the adjacent word lines when a number of program loops in the ISSP scheme exceeds a predetermined number.

5. The method of claim 3, wherein the elevated pass voltage is increased by a predetermined level once the number of program loops increases above the predetermined number.

6. A non-volatile memory device comprising:
    a memory cell array comprising a plurality of memory cells disposed at intersections between word lines and bit lines;
    a word line voltage generator generating a program voltage, an elevated pass voltage and a pass voltage during a program operation; and
    a row decoder receiving the program voltage, the elevated pass voltage, and the pass voltage, and selecting one of the word lines in response to a row address,
    wherein the program voltage is applied to a word line selected by the row decoder, the elevated pass voltage is applied to word lines adjacent to the selected word line, and the pass voltage is applied to the remaining word lines other than the selected word line and the adjacent word lines, and the elevated pass voltage is lower than the program voltage but higher than the pass voltage.

7. The non-volatile memory device of claim 6, wherein a voltage difference between the program voltage and the elevated pass voltage and a voltage difference between the elevated pass voltage and the pass voltage are less than a breakdown voltage for an insulation layer disposed between adjacent word lines.

8. The non-volatile memory device of claim 6, further comprising:
    a control logic controlling the word line voltage generator to generate the program voltage, the elevated pass voltage, and the pass voltage during the program operation.

9. The non-volatile memory device claim 6, wherein the program operation uses an incremental step pulse programming (ISPP) scheme.

10. The non-volatile memory device of claim 9, wherein the control logic determines whether or not a number of program loops in the program operation exceeds a predetermined number, and further controls the row decoder and the word line voltage generator to provide the elevated pass voltage to the adjacent word lines when the number of program loops exceeds the predetermined number.

11. The non-volatile memory device of claim 10, wherein the elevated pass voltage is increased by a predetermined level once the number of program loops increases beyond the predetermined number.

12. The non-volatile memory device of claim 6, wherein the non-volatile memory device is a NAND flash memory.

13. A programming method of a non-volatile memory device, the method comprising:
    applying a pass voltage to all word lines in a first program period;
    applying a program voltage to a selected word line in a second program period; and
    applying a elevated pass voltage to word lines adjacent to the selected word line in the second program period,
    wherein the elevated pass voltage is higher than the pass voltage and lower than the program voltage, and
    a voltage difference between the program voltage and the elevated pass voltage and a voltage difference between the elevated pass voltage and the pass voltage are less than a breakdown voltage of an insulation layer between the word lines.

* * * * *